United States Patent [19]

Asai

[11] Patent Number: 5,060,008
[45] Date of Patent: Oct. 22, 1991

[54] IMAGE RECORDING APPARATUS WHICH REDUCES THE WASTING OF PHOTOSENSITIVE RECORDING MEDIUM WHEN OPERATING IN A PLURAL IMAGE RECORDING MODE

[75] Inventor: Shin Asai, Ichinomiya, Japan

[73] Assignee: Brother Kogyo Kabushiki Kaisha, Japan

[21] Appl. No.: 595,850

[22] Filed: Oct. 11, 1990

[30] Foreign Application Priority Data

Oct. 30, 1989 [JP] Japan ................................. 1-282098

[51] Int. Cl.$^5$ ............................................. G03B 27/52
[52] U.S. Cl. ...................................................... 355/27
[58] Field of Search ................................... 355/27–29, 355/100, 106

[56] References Cited

U.S. PATENT DOCUMENTS

| | | | |
|---|---|---|---|
| 4,801,976 | 1/1989 | Hayashi | 355/28 |
| 4,875,074 | 10/1989 | Sangyoji et al. | 355/27 |
| 4,903,070 | 2/1990 | Nakata et al. | 355/27 |
| 4,939,535 | 7/1990 | Hashimoto et al. | 355/27 |
| 4,959,681 | 9/1990 | Ogura | 355/27 |

FOREIGN PATENT DOCUMENTS 0350310 1/1990 European Pat. Off. .

Primary Examiner—L. T. Hix
Assistant Examiner—D. Rutledge
Attorney, Agent, or Firm—Oliff & Berridge

[57] ABSTRACT

An image recording apparatus for recording an image on an elongated continuous form photosensitive recording medium fed along a recording medium feeding path is disclosed. The apparatus comprises a setting unit for setting a plural image mode of operation where a plurality of images are recorded sequentially upon a single actuation thereof by a operator, an exposing unit for exposing the photosensitive recording medium to a light image at predetermined time intervals as the photosensitive recording medium is fed past an exposure position, a developing unit disposed downstream of the exposing unit along the recording medium feeding path for developing the exposed photosensitive recording medium, a first recording medium feeding unit for feeding the photosensitive recording medium upstream of the exposure position with respect to the recording medium feeding path, a second recording medium feeding unit for feeding the photosensitive recording medium downstream of the exposure position with respect to the recording medium feeding path, and a controlling unit for controlling the first recording medium feeding unit and the second recording medium feeding unit so that the speed of feeding by the first recording medium feeding unit is faster than the speed of feeding by the second recording medium feeding unit at least during an exposing operation when the plural image mode is set by the setting unit.

12 Claims, 6 Drawing Sheets

Fig.5B

| ITEM | INSTRUCTIONS |
|---|---|
| S1 | TURN ON READY LAMP 61d. |
| S2 | IS A SIGNAL INPUT FROM PLURAL COPY SETS KEY 61c? |
| S3 | RECORD IN A NORMAL MANNER. |
| S4 | IS A START SIGNAL INPUT FROM START KEY 61a? |
| S5 | PERFORM EXPOSING OPERATION. |
| S6 | HAS SIGNAL INDICATING END OF EXPOSING OPERATION BEEN INPUT? |
| S7 | PERFORM RECOVERING OPERATION. |
| S8 | HAS SIGNAL INDICATING END OF RECOVERING OPERATION BEEN INPUT? |
| S9 | ARE ALL OF THE PLURAL IMAGES RECORDED? |

IMAGE RECORDING APPARATUS WHICH REDUCES THE WASTING OF PHOTOSENSITIVE RECORDING MEDIUM WHEN OPERATING IN A PLURAL IMAGE RECORDING MODE

Cross-reference is made to the following copending applications of the same assignee which are filed concurrently herewith and disclose the same basic image recording system: U.S. patent application Ser. No. 07/595,405, filed Oct. 11, 1990 to Katsuyoshi Sonore and entitled "Image Recording Apparatus For Inhibiting The Deterioration Of Photosensitive Recording Medium"; U.S. patent application Ser. No. 07/595,411, filed Oct. 11, 1990 to Katsuyoshi Sonore et al and entitled "Image Recording Apparatus Which Discharges An Output Image Sheet Upon Completion Of Photosensitive Recording Medium Adjustment"; and U.S. patent application Ser. No. 07/596,017, filed Oct. 11, 1990 to Masanori Kobayashi et al and entitled "Image Recording Apparatus Which Prohibits Starting Of A Recording Operation Until Completion Of Photosensitive Recording Medium Adjustment". The above-listed applications are herein incorporated by reference.

BACKGROUND OF THE INVENTION

1. Field of the Invention

The present invention relates to an image recording apparatus such as a copying machine or a printer in which a photosensitive recording medium is employed, and more particularly to such an image forming apparatus that employs a continuous form photosensitive recording medium.

2. Discussion of the Related Art

Generally, an image recording apparatus which uses a photosensitive recording medium employs, for example, as disclosed in U.S. Pat. No. 4,903,070, the disclosure of which is herein incorporated by reference, an elongated web-like microcapsule sheet coated with a plurality of photo and pressure sensitive microcapsules, each microcapsule enveloping therein a chromogenic material and a photosensitive resin, and a developer sheet coated with developing material which produces an output image upon reaction with a chromogenic material, as is well known in the art.

The image recording apparatus comprises means for receiving the elongated web-like microcapsule sheet wound around a cartridge shaft and retained in a cartridge, an exposing unit for exposing the microcapsule sheet disposed at an exposure table to form a latent image thereon, a developer sheet feeding unit for feeding a developer sheet from a developer sheet cassette which stores therein, for example, a stack of developer sheets toward an exposed microcapsule sheet, a pressure developing unit for pressurizing the exposed microcapsule sheet superposed with the developer sheet to thereby form an output image on the developer sheet, a separating unit for separating the exposed microcapsule sheet from the developer sheet, a taking-up unit for taking-up the separated microcapsule sheet, and a thermal fixing unit for fixing the output image on the developer sheet.

In this type of image recording apparatus, the elongated microcapsule sheet drawn out of the cartridge passes through the exposing unit, the pressure developing unit and the separating unit, and is taken up by a taking-up unit. The developer sheet and superposed elongated microcapsule sheet containing a latent image are pressurized by the pressure developing unit, and are separated from each other by the separating unit and then the developer sheet is subjected to thermal fixing in the thermal fixing unit. At this time, the copying operation is completed.

However, upon completion of the above copying operation, the leading edge of the unexposed portion of the microcapsule sheet has passed through the pressure developing unit. If the next copying operation is immediately performed in the above mentioned situation, an unexposed portion of microcapsule sheet provided between the trailing edge of the exposed area from the preceding copying operation (now located adjacent the separating unit) and the leading edge of the next exposing area for the next copying operation (now located near the exposing unit), was not fully utilized, resulting in waste of the microcapsule sheet.

In order to prevent waste of photo-pressure sensitive recording sheet, U.S. Pat. No. 4,801,976, the disclosure of which is herein incorporated by reference, discloses a copying machine for copying an image on a photo-pressure sensitive recording sheet. The copying machine comprises an exposing unit for exposing the photo-pressure sensitive sheet placed at an exposure position to form a latent image thereon, a magnification detection unit for detecting the degree of magnification of the image exposed by the exposing unit, and an exposure area controlling unit for controlling a feeding unit in response to said detection unit, whereby the photo-pressure sensitive sheet is exposed by the exposing unit from a leading edge thereof.

However, in this type of conventional copying machine, the leading edge of the photo-pressure sensitive recording sheet is not controlled to be located at the proper exposure position until after the photo-pressure sensitive recording medium having a desired image has been discharged out of the copying machine. For the above mentioned reason, a user must wait for a time period during the adjustment of the leading edge of the photo-pressure sensitive recording sheet to the proper exposure position before proceeding with the next copying operation, after the end of the preceding copying operation. If the user did not wait for this adjustment to occur, but instead proceeded with the next copying operation, a portion of the photosensitive recording medium was wasted.

When the mode where a plurality of images are copied sequentially in one continuous operation is set in these types of image recording machines, a large quantity of the photosensitive recording medium is wasted because the above-described adjusting operation is not performed between each of the multiple consecutive copies. For example, it is often desirable to operate these types of image recording devices in a plural image recording mode wherein a user actuates a plural copy set key a single time to cause a copying operation (including exposing, developing, separating, etc.) to occur more than one time. Typically the plural image recording mode is used when more than one copy of an image is desired. Additionally, the plural image mode can be used if a document handler is employed with the image recording device to consecutively place a sequence of images to be copied on a support stand glass of the image recording device. In this case, the image recording device would perform a copying operation as each image to be copied is placed on the support stand glass. Since the photosensitive recording medium is continuously fed by the image recording device when in this plural image recording mode, even during the time between exposure operations of consecutive copying operations, a portion of the photosensitive recording medium will not be exposed with an image and thus will be wasted.

OBJECTS AND SUMMARY OF THE INVENTION

It is therefore an object of the present invention to overcome the above-described drawbacks and disadvantages, and to provide an image recording apparatus with which a user can record an image on a photosensitive recording medium, without waiting for a time period for completion of adjustment of the leading edge of the photosensitive recording medium prior to proceeding with the next copying operation after the end of a preceding copying operation and without wasting any of the photosensitive recording medium.

Another object of the present invention is to provide an image recording apparatus that does not waste the photosensitive recording sheet.

Still another object of the present invention is to provide an image recording apparatus that has a highly efficient utilization of the photosensitive recording medium even in the mode where a plurality of images are copied sequentially.

To attain these and other objects, according to the present invention, there is provided an image recording apparatus for recording an image on an elongated continuous form photosensitive recording medium, said apparatus defining a recording medium feeding path and comprising: setting means for setting a plural image mode of operation wherein a plurality of images are copied sequentially upon a single actuation thereof by an operator; exposing means for exposing the photosensitive recording medium to a light image at predetermined time intervals as the elongated continuous form photosensitive recording medium is fed along said recording medium feeding path to form an image thereon, said exposing means having an exposure position at which a leading edge of a portion of the photosensitive sheet is located prior to exposure to the light image thereon; developing means, disposed downstream of said exposing means with respect to said recording medium feeding path, for developing the exposed photosensitive recording medium; first recording medium feeding means for feeding said photosensitive recording medium upstream of the exposure position with respect to said recording medium feeding path; second recording medium feeding means for feeding said photosensitive recording medium downstream of the exposure position through the developing means with respect to said recording medium feeding path; and controlling means for controlling said first recording medium feeding means and said second recording medium feeding means so that the speed of feeding of the photosensitive recording medium by said first recording medium feeding means is faster than the speed of feeding of the photosensitive recording medium by said second recording medium feeding means at least during an exposing operation where the photosensitive recording medium is being exposed to the light image when said plural image mode is set by the setting means.

In the above-described image forming apparatus of the present invention, when the mode for copying plural sequential images is set by the setting means, an image recording apparatus records a plurality of images sequentially on an elongated continuous form photosensitive recording medium. The photosensitive recording medium is fed from the upstream side of the exposure position to the exposure position by first recording medium feeding means. The photosensitive recording medium is fed downstream of the exposure position through the developing means by a second recording medium feeding means. The controlling means controls said first recording medium feeding means and said second recording medium feeding means so that the speed at which the photosensitive recording medium is fed by said first recording medium feeding means is faster than the speed at which the photosensitive recording medium is fed by said second recording medium feeding means at least during an exposing operation where the photosensitive recording medium is being exposed by the exposing means.

Thus, with the present invention, the exposing means exposes the photosensitive recording medium to a light image a plurality of times at predetermined time intervals at the exposure position. During each exposing operation, the first recording medium feeding means supplies photosensitive recording medium to the exposure position at a certain speed. However, after completion of each exposing operation wherein a portion of the photosensitive recording medium is exposed to the light images, the speed of feeding of the photosensitive recording medium (as fed by said first recording medium feeding means) is reduced until the predetermined time period expires and a next portion of the photosensitive recording medium is to be exposed to a light image, at which time the photosensitive recording medium is again conveyed at the faster speed (by the first recording medium feeding means). During almost the entire plural image mode of operation, the second recording medium feeding means conveys the photosensitive recording medium downstream of said exposure position at the reduced speed. Thus, the amount of photosensitive recording medium which is wasted between each exposing operation of the plural image mode is reduced. Accordingly, the image recording apparatus can avoid the wasting of photosensitive recording medium and can operate in a highly efficient manner when in the plural image mode of operation where a plurality of images are recorded sequentially upon a single operator actuation.

BRIEF DESCRIPTION OF THE DRAWINGS

The foregoing and other objects, features and advantages of the present invention will become more apparent by reading the following detailed description of a presently preferred embodiment of the invention, when considered in connection with the accompanying drawings, in which:

FIGS. 5A and 5B are a flow chart and table, respectively, illustrating the operation of the controller.

DETAILED DESCRIPTION OF THE PREFERRED EMBODIMENT

Figure 1:
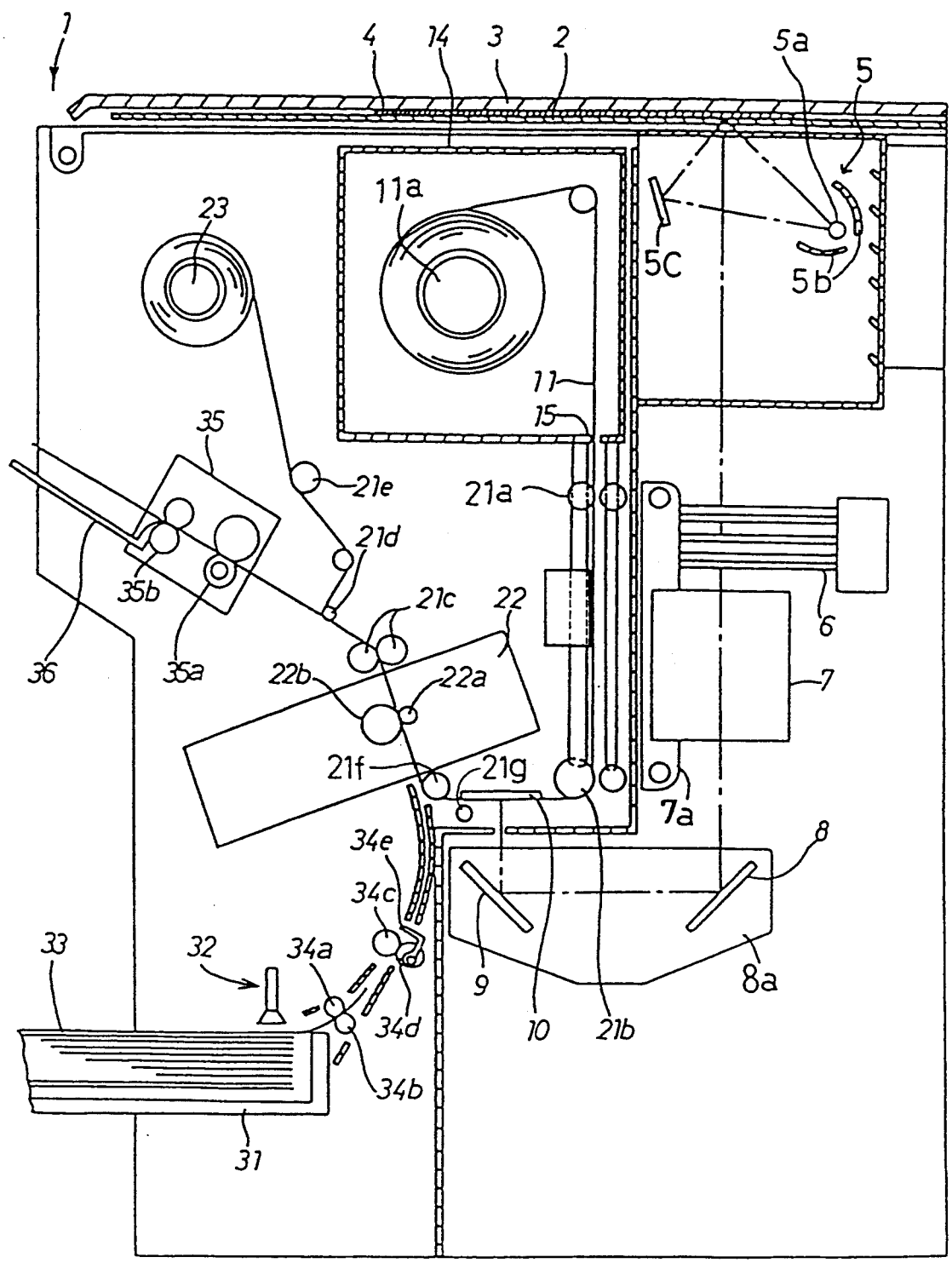
FIG. 1 is a schematic elevational view in cross section of one embodiment of an image forming apparatus of the present invention.

One embodiment according to the present invention is shown in FIGS. 1-5. FIG. 1 schematically shows an image recording machine according to an embodiment of the disclosed invention. The illustrated image recording machine, generally indicated at 1, is a photosensitive pressure-sensitive copying machine capable of copying and producing full-color images.

The photosensitive recording medium is of a transfer type recording medium which comprises a first image recording medium and a second image recording medium. More specifically, the first image recording medium comprises a photosensitive pressure sensitive recording medium provided with microcapsules which encapsulate therein a first material (chromogenic material or dye precursor) having first and second phases dependent on light exposure. The second image recording medium comprises a developer medium coated on a substrate with a second material (developer material) which provides an output image upon reaction with the first material. Such an image recording medium is disclosed in, for example, U.S. Pat. No. 4,399,209 and Japanese Patent Application Kokai No. 58-88739.

The copying machine employs a continuous photosensitive pressure-sensitive recording medium such as a microcapsule sheet 11 for recording a latent image thereon, and a developer sheet 33 for receiving a developed color image from the microcapsule sheet 11.

The copying machine 1 includes an upper panel assembly having an original support stand glass 2 which is movable back and forth and an original support stand glass cover 3 that can be placed over the original support stand glass 2. An original 4 to be copied is placed on the original support stand glass 2, which is formed of light transmissive material. The copying machine 1 also has a light source 5 placed in an upper righthand portion thereof below the original support stand glass 2 comprising a halogen lamp 5a extending in a direction normal to the direction in which the original support stand glass 2 is movable back and forth, and semicylindrical reflecting mirrors 5b disposed in surrounding relation to the halogen lamp 5a. The light source emits a linear-line of light toward the lower surface of the original support stand glass 2.

When the original support glass 2 moves, the light emitted from the halogen lamp 5a sequentially irradiates the entire surface of the original support stand glass 2 from the lefthand to the righthand end thereof (as viewed in FIG. 1). The light from the light source 5 passes through the transparent original support stand glass 2, and is then reflected by the original 4 placed on the original support stand glass 2. The original support stand glass cover 3 covers the entire upper surface of the original support stand glass 2 so that the light applied to the original support stand 2 will not leak out from those areas of the original support stand glass 2 which are not covered by the original.

A reflector 5c is positioned on the lefthand side of the light source for applying light emitted from the halogen lamp 5a to the original in a highly efficient manner. The reflectors 5b reflect light which is not initially directed toward the original support glass 2.

The light reflected from the original on the original support stand glass 2 is directed downwardly and passes through a filter 6 and a lens 7. The filter 6 serves to pass desired wavelengths of light dependent on the sensitivity of a microcapsule sheet 11 for adjusting the colors of a copied image. The lens 7 is mounted on a lens attachment 7a which is slightly adjustable with respect to the path of the light through the filter 6 and the lens 7.

The light converged by the lens 7 is directed 180 degrees by two reflecting mirror 8, 9 and then focused on the microcapsule sheet 11 held closely against the lower surface of an exposure table 10. The reflecting mirrors 8, 9 are mounted on a mirror attachment 8a which is slightly positionally adjustable to vary the length of the light path for focusing.

The microcapsule sheet 11 is of a continuously elongated length and is wound around a cartridge reel 11a, and the wound microcapsule sheet 11 is placed in a removable cartridge 14 positioned below the original support stand glass 2. Cartridge 14 includes an outlet 15 through which microcapsule sheet is conveyed. A leading end portion of the microcapsule sheet 11 which is provided with a leader consisting of a suitable sheet fixed to the leading edge of the photosensitive material extends through many rollers 21a, 21b, 21c, a pressure developing unit 22, and a separator roller 21d toward a takeup reel 23.

As shown in FIG. 1 the microcapsule sheet 11 drawn out of the cartridge 14 from the lower end is fed and guided by a feed roller 21a and a guide roller 21b, and extends beneath the exposure table 10 into the pressure developing unit 22. The microcapsule sheet 11 which has passed through the pressure developing unit 22 is fed by a pair of feed roller 21c, travels past a separator roller 21d and an adjustment roller 21e, and is then wound around the takeup reel 23. The microcapsule sheet 11 discharged from the cartridge 14 is prevented from being prematurely exposed by a light-shielding cover prior to reaching the exposure table 10.

The speed at which the microcapsule sheet 11 is fed during an exposing operation of a recording operation is controlled so as to be held at a constant level, and remains substantially the same speed at which the original support stand glass 2 is moved. Therefore, a latent image can be formed successively line by line on the microcapsule sheet 11 when it moves past the exposure table 10. In the vicinity of the exposure table 10, a microcapsule sheet guide 21g is provided to guide the microcapsule sheet 11 along the microcapsule sheet path. Between the microcapsule sheet guide 21g and a pressure developing unit 22 described below, a tension roller 21f for moving upward and downward is disposed. Tension roller 21f maintains the tension of the microcapsule sheet 11. Tension rollers, per se, are well known. See, for example, U.S. Pat. No. 4,875,074, the disclosure of which is herein incorporated by reference.

A developer sheet cassette 31 storing a stack of developer sheets 33 is disposed below the pressure developing unit 22. The developer sheets 33 are taken out of cassette 31 one at a time by a sheet feed mechanism 32 which attracts the developer sheets 33 with suction. Each developer sheet 33 which is taken from the cassette 31 is conveyed further by a feed roller 34a and a pinch roller 34b. After the leading end of the developer sheet 33 is aligned by rollers 34c, 34d and a resist gate 34e, the developer sheet 33 is fed into an inlet slot of the pressure developing unit 22.

The microcapsule sheet 11 and the developer sheet 33 are closely held against each other, when they are introduced into the pressure developing unit 22. The pressure developing unit 22 includes a small diameter roller 22a and a backup roller 22b. The microcapsule sheet 11 and the developer sheet 33 are sandwiched and pressed together between the small diameter roller 22a and the backup roller 22b. At this time, a microcapsule layer on the microcapsule sheet 11 with the latent image formed thereon and a color developer layer on the developer sheet 33 are held against each other. Those microcapsules in the microcapsule layer which are not exposed are ruptured under pressure, and a developed image is transferred onto the developer sheet 33.

The microcapsule sheet 11 and the developer sheet 33 which have left the pressure developing unit 22 are fed by the rollers 21c. Then, the microcapsule sheet 11 is separated from the developer sheet 33 by the separator roller 21d. The microcapsule sheet 11 is directed upwardly, whereas the developer sheet 33 travels straight ahead into a thermal fixing unit 35. The thermal fixing unit 35 includes a heater roller 35a and feed roller 35b. After color development on the developer sheet 33 is promoted and the color image is fixed by the heat fixing unit 35, the developer sheet 33 is discharged into a tray 36 with the developed image facing up. The separated microcapsule sheet 11 travels past the adjustment roller 21e and is wound around the take-up reel 23.

Figure 2:
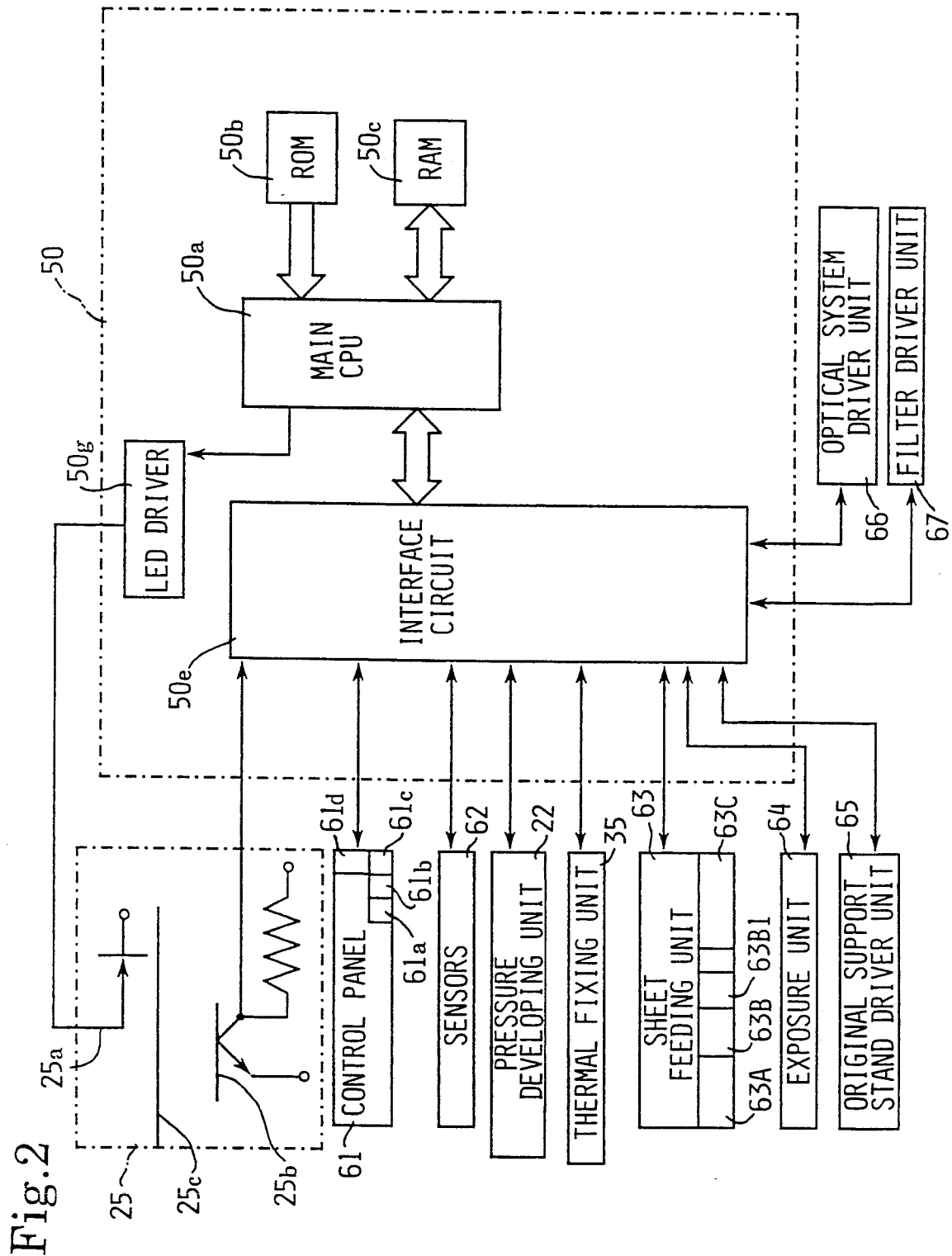
FIG. 2 is a block diagram showing a controller which includes an electrical control circuit.

There will next be described an arrangement of the controller 50, in the instant apparatus 1 by reference to the block diagram of FIG. 2. As illustrated in FIG. 2, the controller 50 includes an interface circuit 50e, and a main CPU (central processing unit) 50a, to which are connected through the interface circuit 50e an encoder 25, a control panel 61, sensors 62, a pressure developing unit 22, a thermal fixing unit 35, a sheet feeding unit 63, an exposure unit 64, an original support stand driver unit 65, an optical system driver unit 66, and a filter driver unit 67.

A control panel 61 has a start key 61a, a lamp 61b for indicating an operating mode of machine 1 when a copying operation is being performed and a plural copying set key 61c which a user actuates once when it is desired to record a plurality of images sequentially. Other input keys (not shown) are provided which generate, for example, a pulse indicating the data relating to the number of copies to be made when plural copying set key 61c is activated and transmitting this data to main CPU 50a. Ready lamp 61d is also provided to indicate a ready state of the copying machine 1.

Sensors 62 are disposed in machine 1 and transmit signals to main CPU 50a to aid in control of machine 1. Sheet feeding unit 63 includes a developer sheet feeding portion 63A which controls the feeding of a developer sheet 33, a microcapsule sheet feeding portion 63B which controls the feeding of a microcapsule sheet 11 and includes driving portion 63B1, and a separator driving portion 63C for driving separator roller 21d. Exposure unit 64 controls halogen lamp 5a (i.e., turns lamp 5a on and off). The original support stand driver unit 65 controls an original support stand glass 2 to move back and forth. Optical system unit 66 controls lens 7 and mirrors 8,9 so that they are located in a suitable position. The filter driver unit 67 controls the filter 6 so that it is located in a suitable position.

The CPU 50a is further connected to a ROM (read-only memory) 50b and a RAM (random-access memory) 50c. The RAM 50c acts as a work area for performing various types of processing and also stores data temporarily. ROM 50b stores various types of processing programs and also stores initial data. Main CPU 50a operates to control the present image forming apparatus, according to one or more control programs stored in the ROM 50b while utilizing the temporary data storage function of RAM 50c. Encoder 25 includes a rotating plate 25c having many slits disposed along a circumference thereof and connected to rotate with roller 21b a light-emitting element 25a for producing and directing a light beam toward the rotating plate 25c, and a light-sensitive element 25b for receiving the light beam transmitted through slits of the rotating plate 25c, whereby the encoder 25 generates a pulse signal corresponding to the rotation of the rotating plate 25c based on the output of a light-sensitive element 25b. Main CPU 50a is connected to the encoder 25 to receive the output of the encoder 25 through the interface 50e, and the light-emitting element 25a is connected to the main CPU 50a in controller 50 through a light-emitting element driver 50g. CPU 50a is adapted to count the number of pulses and to determine the amount and direction of the rotation of the feeding roller 21b based on the received pulse signals. Encoder 25 is used to monitor the feeding speed of microcapsule sheet 11.

Figure 3:
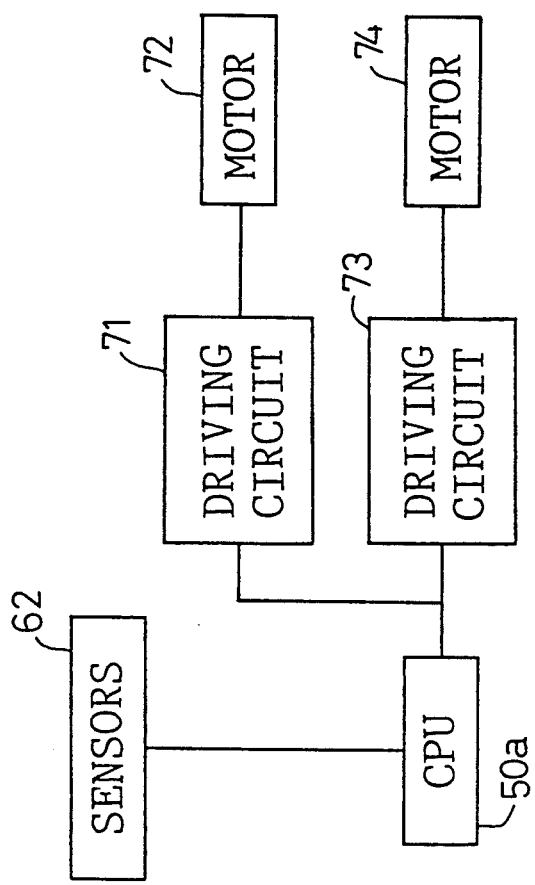
FIG. 3 is a schematic block diagram showing a driver circuit of the controller.

There will next be described an arrangement of the sheet feeding unit 63 and controller 50, by reference to the block diagram of FIG. 3. A microcapsule sheet feeding portion 63B which controls the feeding of a microcapsule sheet 11 includes a driving circuit 71 connected to a motor 72 for feeding the microcapsule sheet 11 from the cartridge reel 11a approximately to the microcapsule sheet guide roller 21g at one of two constant speeds V1 or V2 (to be described below), and a driving circuit 73 connected to a motor 74 for feeding the microcapsule sheet 11 from the microcapsule sheet guide roller 21g to the separator roller 21d at a constant speed V2.

Figure 4:
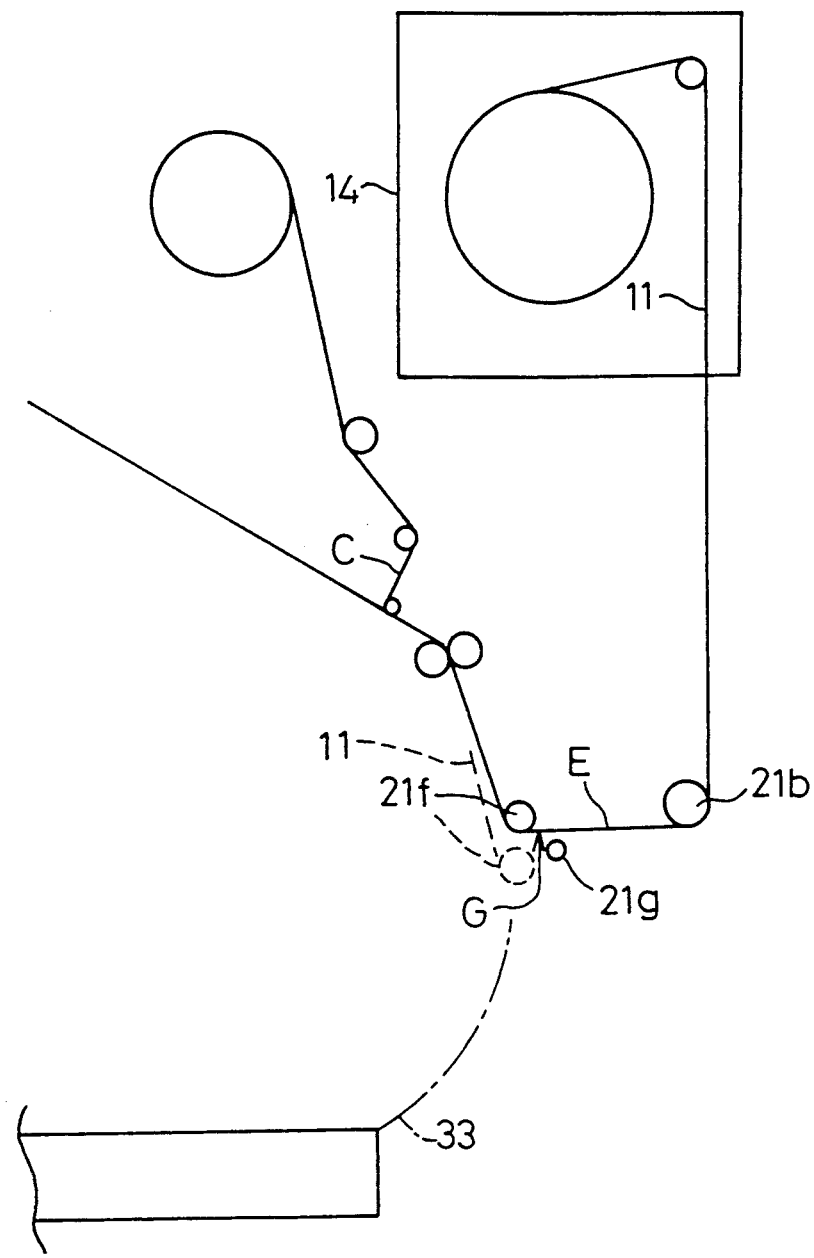
FIG. 4 is a view showing a feeding path of a photosensitive pressure sensitive recording sheet and the length prescribed between the predetermined positions along the feeding path.

More specifically, as shown in FIG. 4, when the exposing operation of the preceding copying operation (wherein microcapsule sheet is fed from cartridge 14 through exposing table 10 at speed V1) is finished, the trailing edge of the exposed portion of the microcapsule sheet 11 is placed at a leading position (or exposure position) E of the exposure area disposed at the lower surface of the exposure table 10. If photosensitive sheet 11 is then supplied from reel 11a at this same speed (V1) until the exposing operation of the next copying operation is started, the microcapsule sheet 11 will have traveled the microcapsule sheet path by a distance D1 calculated according to formula (1) described below based on the speed V1 and the time T1 between the end of the preceding exposing operation and the start of the next exposing operation:

$$D1 = V1 \cdot T1. \tag{1}$$

This distance D1 is equal to the length of photosensitive sheet between the trailing edge of the exposed portion of photosensitive sheet 11 from the first (preceding) copying operation and the leading edge of the exposed portion of photosensitive sheet 11 from the next (subsequent) copying operation. Thus, between each copying operation, a length D1 of photosensitive sheet 11 would be wasted. Accordingly, when the speed V1 is reduced to V2 for conveying sheet 11 from roller 21g to roller 21d, the length of the wasted portion of microcapsule sheet 11 is reduced. Thus, if photosensitive sheet is supplied from cartridge reel 11a at a speed V2, wherein V2 is slower than V1, during the time period T1 between completion of the exposing operation of the preceding copying operation and the starting of the exposing operation of the subsequent copying operation, the microcapsule sheet 11 will have traveled a distance D2 according to formula (2) below:

$$D2 = V2 \cdot T1. \quad (2)$$

Thus, by reducing the speed of supplying microcapsule sheet 11 from cartridge 14 between consecutive exposing operations from V1 to V2, the amount of microcapsule sheet 11 which can be saved, S, can be calculated according to formula (3) below:

$$S = D1 - D2. \quad (3)$$

Substituting the values of D1 and D2 from formulas (1) and (2) into formula (3) results in formula (4):

$$S = (V1 - V2) \cdot T1. \quad (4)$$

Thus, the lower the value of V2, the less microcapsule sheet 11 is wasted between exposing operations.

It would be desirable to supply microcapsule sheet from cartridge 14 at low speed V2 at all times, however, during the exposing operation, the speed which microcapsule sheet 11 must be conveyed past exposure position E must be substantially the same as the speed which original support stand glass 2 is moved from right to left in order to properly form images on the microcapsule sheet 11. Original support stand glass 2 is moved from right to left at higher speed V1 in order to record images quickly. Thus, microcapsule sheet 11 is conveyed from cartridge 14 alternately at speeds V1 and V2 depending on whether an exposing operation is being performed, or whether machine 1 is between exposing operations.

It would also be desirable to convey microcapsule sheet 11 downstream of exposure position E through developer unit 22 at the same speed as sheet is supplied to exposure position E from upstream thereof (i.e., alternating speeds V1 and V2). However, varying the speed at which microcapsule sheet 11 and developer sheet 33 are fed through developing unit 22 causes imperfect, distorted output images to be recorded on the developer sheets 33. Thus, microcapsule sheet 11 must be conveyed downstream of exposure position E through developer unit 22 at a constant speed which is the slower speed V2. Therefor, when the plural copy set key 61c is pressed, machine 1 operates in a plural imaging mode, wherein microcapsule sheet is supplied to exposure position E from cartridge 14 at speed V1 during exposing operations, is supplied to exposure position E from cartridge 14 at speed V2 between exposing operations, and is fed downstream of exposure position E through developer unit 22 at a constant speed V2 at all times. When operating in a "normal" manner (wherein a single image is recorded once), microcapsule sheet 11 is fed upstream and downstream of exposure position E at equal speeds (for example, V1).

Thus, in order to reduce the amount of microcapsule sheet 11 which is wasted while recording images in the plural image recording mode of operation, an image recording machine according to the present invention reduces the speed at which the microcapsule sheet 11 is fed from cartridge 14 to exposure position E between exposing operations from speed V1 to reduced speed V2. When the next exposing operation is started, the trailing edge of the exposed portion of microcapsule sheet 11 from the preceding exposing operation is located at a position G prescribed to be spaced a short distance from the guide roller 21g (and also spaced a short distance downstream of exposure position E) along the microcapsule sheet feeding path. However, since microcapsule sheet 11 is fed upstream of exposure position E at a higher speed (V1) than it is fed downstream of exposure position E (V2) during the exposing operation, a length L of microcapsule sheet 11 accumulates between developer unit 22 and exposure position E during each exposing operation. A tension is maintained on this accumulated microcapsule sheet with tension roller 21f to prevent paper jams and to maintain output image quality. The length L of microcapsule sheet 11 which accumulates between developer unit 22 and exposure position E can be calculated according to formula (5) below, wherein T2 is the duration of the exposing operation, and thus, the amount of time at which microcapsule sheet is fed upstream and downstream of exposure position E at different speeds V1 and V2 respectively:

$$L = (V1 - V2) \cdot T2. \quad (5)$$

Figure 5A:
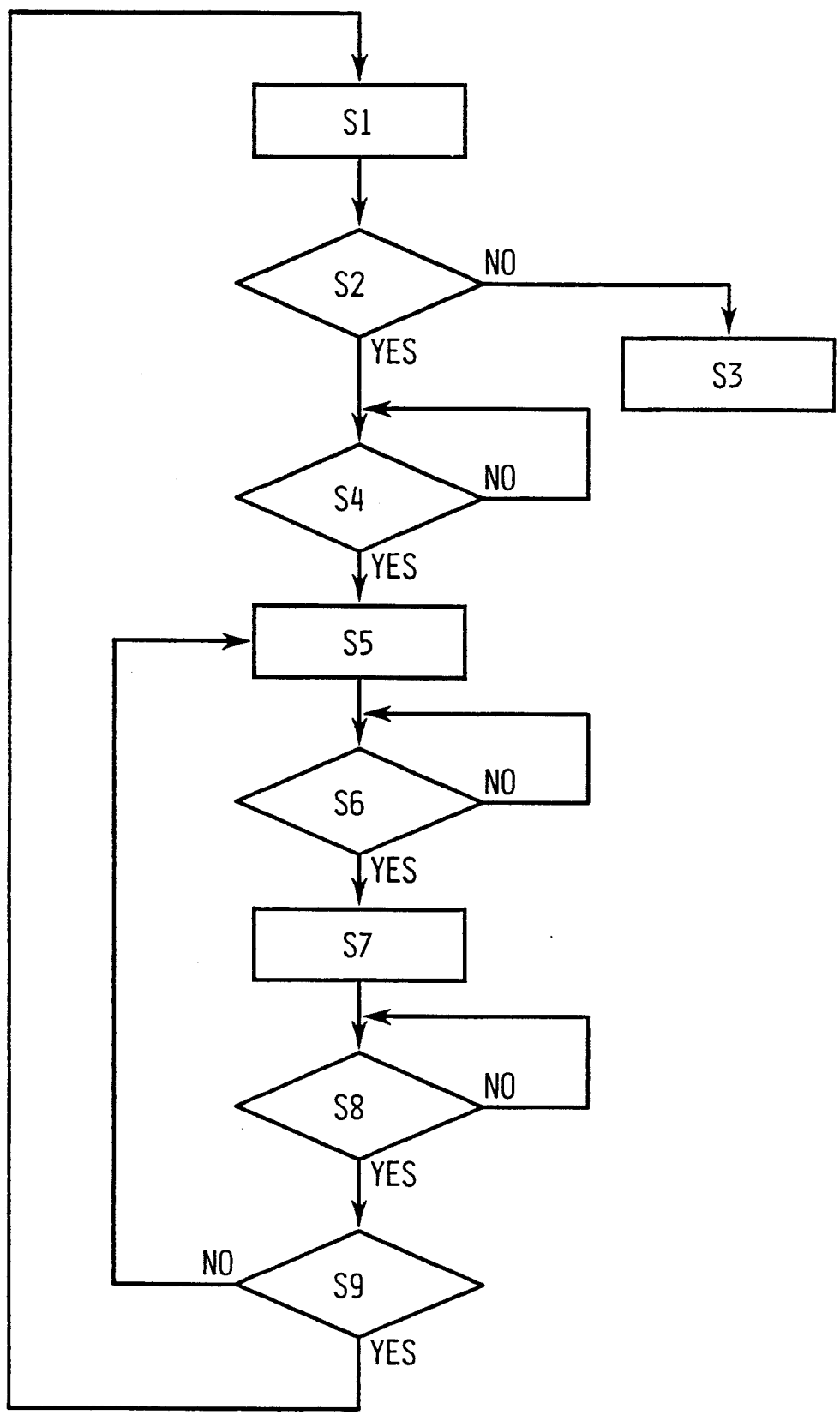

The arrangement as described above is operated as described below with reference to the flow chart shown in FIG. 5. When the copying machine 1 is ready for recording an image on the microcapsule sheet 11, the controller turns on the ready lamp 61d to indicate a ready state of the copying machine 1 (step 1; hereinafter indicated simply by S1, and following steps are indicated in a like manner). The controller 50 determines whether a signal has been input from the plural copy set key 61c to record a plurality of images sequentially in S2. If the controller 50 does not detect the pulse input from the plural copy set key 61c to record a plurality of images sequentially (No at S2), the controller 50 controls copy machine 1 to record an image on a microcapsule sheet 11 and a developer sheet 33 in a conventional manner in S3. If the controller 50 detects the pulse input from the plural copy set key to record a plurality of images sequentially (Yes at S2), the controller 50 proceeds to S4. In S4, controller 50 determines whether a start signal has been input from the start key 61a (S4). Controller 50 repeats S4 until a user actuates the start key 61a. When the controller 50 detects a start signal, the controller 50 proceeds to S5 where it controls copying machine 1 so that the stand glass 2 is moved rightward of FIG. 1 and brought to a stop at a position where the left end of the glass 2 is to be lighted with the halogen lamp 5a. Also in S5, the controller 50 starts to control the microcapsule sheet feeding portion 63B, the exposure unit 64 and the original support stand driver unit 65 so that the exposure unit 64 exposes an imagewise light onto the microcapsule sheet 11, the microcapsule sheet feeding portion 63B feeds the microcapsule sheet 11 from cartridge 14 to exposure position E at the constant speed V1 while feeding microcapsule sheet 11 downstream of exposure position E through developer unit 22 at reduced speed V2, and the original support stand driver unit 65 moves the original support stand glass 2 from the left end to the right end thereof at a corresponding speed (V1). During this time, the halogen lamp 5a is turned on, and the light emitted from the lamp 5a is reflected by the original 4 supported on the glass stand 2 and transmitted through the filter 6, the lens system 7 and the reflection mirrors 8,9 to form a latent image on the microcapsule sheet 11. The controller 50 determines whether the operation of exposing the light image on microcapsule sheet 11 is completed in S6.

When the controller 50 detects the end of this exposing operation on microcapsule sheet 11 based on a signal from one of the sensors 62, the controller 50 performs a "recovering operation" where it controls the microcapsule sheet feeding portion 63B, the original support stand driver unit 65 and the exposure unit 64 so that the halogen lamp 5a is turned off, the microcapsule sheet feeding portion 63B feeds the microcapsule sheet 11 upstream and downstream of exposure position E at the constant speed V2 which is slower than the speed V1, and the original support stand driver unit 65 moves the original support stand glass 2 from the right end to the left end thereof in S7.

When the controller 50 detects a signal input from another sensor 62, which signal indicates the resumption of the exposing operation (S8) (this signal indicates that copying machine 1 is ready to make another image similar to the previous image because plural copy set key 61c was activated in S2), the controller 50 proceeds to step S9 where it is determined whether all of the plural images to be recorded based upon the single actuation of plural copy set key 61c have been recorded. If the answer in S9 is YES, the routine proceeds to S1. If the answer in S9 is NO, more images are to be recorded and therefor, the routine proceeds to S5. In S5, the controller 50 starts to control the microcapsule sheet feeding portion 63B, the exposure unit 64 and the original support stand driver unit 65 so that the exposure unit 64 exposes a light image onto microcapsule sheet 11, the microcapsule sheet feeding portion 63B feeds the microcapsule sheet 11 from cartridge 14 to exposure position E at the constant speed V1 while feeding microcapsule sheet 11 downstream of exposure position E through developing unit 22 at reduced speed V2, and the original support stand driver unit 65 moves the original support stand glass 2 from the left end to the right end thereof at a corresponding speed V1. S6–S9 are performed as described above. The controller 50 will repeat S5–S9 until the number of plural copies selected with plural copy set key 61c are recorded. After the last copy of the plural copies selected by plural copy set key 61c is recorded, the procedure will proceed from S9 to S1. Thus, since the speed at which the microcapsule sheet 11 is conveyed downstream of the exposure position on exposing table 10 (speed V2) is slower than the speed at which the microcapsule sheet is conveyed upstream of the exposure position of exposing table 10 (V1) during exposing operations, as opposed to previous systems which conveyed microcapsule sheet at the same speed (e.g., V1) upstream and downstream of the exposure position, the amount of unexposed microcapsule sheet resulting when operating in a plural copy set mode is reduced.

To compensate for the slower conveying speed downstream of the exposure position during the exposing operation, tension roller 21f is provided and maintains tension on microcapsule sheet while permitting microcapsule sheet to accumulate between exposure table 10 and developer unit 22. As the copying machine 1 is performing the recovering operation, the feeding of microcapsule sheet from cartridge 14 to the exposure position E can be stopped for a short time period to allow the portion of microcapsule sheet which has accumulated between the exposure position and developer unit 22 to dissipate. This "dissipation step" is particularly useful when many copies are being made in the plural copy set mode of operation. Alternatively, the number of plural copies which are made in the plural copy set mode can be limited so that too much photosensitive sheet material does not accumulate between exposure table 10 and developing unit 22.

With the leftward movement of the stand glass 2, a developer sheet 33 is picked up by the sheet feed mechanism 32 from the developer sheet cassette 31 and is laid upon the exposed portion of the microcapsule sheet 11 to be fed to the pressure developing unit 22. The microcapsule sheet 11 and the developer sheet 33 are sandwiched and pressed together between the pressure developing rollers 22a, 22b.

The microcapsule sheet 11 and the developer sheet 33 which have left the pressure developing unit 22 are fed by rollers 21c. The microcapsule sheet 11 is separated from the developer sheet 33 by the separator roll 21d. The microcapsule sheet 11 is directed upwardly, whereas the developer sheet 33 travels ahead into the thermal fixing unit 35.

After color development on the developer sheet 33 is fixed by the thermal fixing unit 36, the developer sheet 33 is discharged into a tray 36 with the developed image facing up. The separated microcapsule sheet 11 travels past the adjustment roller 21e and is wound around the takeup reel 23.

Accordingly, the image copying apparatus described above comprises: setting means 61c for setting a plural image mode of operation wherein a plurality of images are copied sequentially upon a single actuation thereof by an operator; exposing means for exposing an elongated continuous form photosensitive recording medium to a light image at predetermined time intervals as the elongated continuous form photosensitive recording medium 11 is fed along a recording medium feeding path to form an image thereon, said exposing means having an exposure position at which a leading edge of a portion of the photosensitive recording medium is located prior to exposure thereof to the light image; developing means 22 disposed downstream of said exposing means with respect to said recording medium feeding path for developing the exposed photosensitive recording medium 11; first recording medium feeding means 71, 72 for feeding said photosensitive recording medium 11 upstream of the exposure position E with respect to said recording medium feeding path; second recording medium feeding means 73,74 for feeding said photosensitive recording medium 11 downstream of the exposure position E through the developing means 22 with respect to said recording medium feeding path; and controlling means 50a for controlling said first recording medium feeding means 71, 72 and said second recording medium feeding means 73, 74 so that the speed of feeding of the photosensitive recording medium by said first recording medium feeding means 71, 72 is faster than the speed of feeding of the photosensitive recording medium by said second recording medium feeding means 73, 74, at least during an exposing operation wherein the photosensitive recording medium is being exposed to the light image when said plural image mode is set by the setting means 61c.

As an alternative embodiment, the exposing means can be constructed so that an original supported by the support stand glass is not movable back and forth, and the light source is held at a predetermined position, but instead may be constructed so that the light source is movable back and forth, and an original supported by the support stand glass is held at a predetermined position.

Furthermore, the present invention is usable with an image recording device which uses a single sheet type of image recording medium, such as disclosed in U.S. Pat. No. 4,801,976. In such a device, the output image sheet which contains the developed image is a portion of the same sheet which contains the photosensitive recording material, which portion is exposed, developed, and separated from the unexposed portion of the photosensitive sheet by, for example, cutting. This differs somewhat from the two sheet type of image recording medium illustrated in the present specification where the output image sheet is a developer sheet, separate from the photosensitive sheet. However, all of the above-described advantages and objects are achieved when the present invention is applied to a machine which uses the single sheet type of recording medium as opposed to a machine which uses the two sheet type of recording medium.

While this invention has been described in conjunction with specific embodiments thereof, it is evident that many alternative modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An image recording apparatus defining a recording medium feeding path and comprising:

setting means for setting a plural image mode of operation wherein a plurality of images are copied sequentially upon a single actuation thereof by an operator;

exposing means for exposing an elongated continuous form photosensitive recording medium to a light image at predetermined time intervals as the photosensitive recording medium is fed along said recording medium feeding path, said exposing means having an exposure position at which a leading edge of a portion of the photosensitive recording medium is located prior to exposure thereof to the light image;

developing means, disposed downstream of said exposing means with respect to said recording medium feeding path, for developing the exposed photosensitive recording medium;

first recording medium feeding means for feeding said photosensitive recording medium upstream of the exposure position with respect to said recording medium feeding path;

second recording medium feeding means for feeding said photosensitive recording medium downstream of the exposure position through the developing means with respect to said recording medium feeding path; and controlling means for controlling said first recording medium feeding means and said second recording medium feeding means so that the photosensitive recording medium is continuously fed downstream of said exposure position by said second recording medium feeding means while the photosensitive recording medium is being fed upstream of said exposure position by said first recording medium feeding means, and wherein the speed of feeding of the photosensitive recording medium by said first recording medium feeding means is faster than the speed of feeding of the photosensitive recording medium by said second recording medium feeding means, at least during an exposing operation when the photosensitive recording medium is being exposed to the light image when said plural image mode is set by the setting means.

2. The image recording apparatus as defined in claim 1, wherein said controlling means comprises a CPU, a ROM, and a RAM, said ROM being provided with a program for controlling said first recording medium feeding means and said second recording medium feeding means.

3. The image recording apparatus as defined in claim 1, wherein said controlling means controls said first recording medium feeding means and said second recording medium feeding means so that the speed of feeding of the photosensitive recording medium by said first recording medium feeding means is faster than the speed of feeding of the photosensitive recording medium by said second recording medium feeding means only during said exposing operation.

4. The image recording apparatus as defined in claim 1, wherein said controlling means controls said first recording medium feeding means and said second recording medium feeding means so that the speed of feeding of the photosensitive recording medium by said first recording medium feeding means is substantially equal to the speed of feeding of the photosensitive recording medium by said second recording medium feeding means at all times between exposing operations when said plural imaging mode is set by said setting means.

5. The image recording apparatus as defined in claim 4, wherein said equal speed is the speed at which the photosensitive recording medium is fed by said second recording medium feeding means during the exposing operation.

6. An image recording apparatus, operable in a plural imaging mode of operation wherein a plurality of images are copied sequentially upon a single actuation of a key by an operator, said apparatus defining a recording medium feeding path and comprising:

exposing means for exposing an elongated continuous form photosensitive recording medium to a light image at predetermined time intervals as the photosensitive recording medium is fed along said recording medium feeding path, said exposing means having an exposure position at which a leading edge of a portion of the photosensitive recording medium is located prior to exposure thereof to the light image;

developing means, disposed downstream of said exposing means with respect to said recording medium feeding path, for developing the exposed photosensitive recording medium;

first recording medium feeding means for feeding said photosensitive recording medium upstream of the exposure position with respect to said recording medium feeding path;

second recording medium feeding means for feeding said photosensitive recording medium downstream of the exposure position, through the developing means with respect to said recording medium feeding path; and controlling means for controlling said first recording medium feeding means and said second recording medium feeding means so that the speed of feeding of the photosensitive recording medium by said first recording medium feeding means is faster than the speed of feeding of the photosensitive recording medium by said second recording medium feeding means, at least during an exposing operation when the photosensitive recording medium is being exposed to the light image, the speed of feeding of the photosensitive recording medium by said first recording medium feeding means at all times between consecutive exposing operations being less than the speed of feeding of the photosensitive recording medium by said first recording medium feeding means during the exposing operation, when said apparatus is operating in said plural imaging mode of operation.

7. The image recording apparatus as defined in claim 6, further comprising:
means for receiving a cartridge of photosensitive recording medium, wherein said first recording medium feeding means supplies photosensitive recording medium from a cartridge received by said means for receiving a cartridge to said exposure position.

8. The image recording apparatus as defined in claim 6, wherein said controlling means controls said first recording medium feeding means and said second recording medium feeding means so that the speed of feeding of the photosensitive recording medium by said first recording medium feeding means is faster than the speed of feeding of the photosensitive recording medium by said second recording medium feeding means only during the exposing operation.

9. The image recording apparatus as defined in claim 6, wherein said controlling means controls said first recording medium feeding means and said second recording medium feeding means so that the speed of feeding of the photosensitive recording medium by said first recording medium feeding means is substantially equal to the speed of feeding of the photosensitive recording medium by said second recording medium feeding means at all times between exposing operations when said plural imaging mode is set by said setting means.

10. The image recording apparatus as defined in claim 9, wherein said equal speed is the speed at which the photosensitive recording medium is fed by said second recording medium feeding means during the exposing operation.

11. An image recording apparatus, operable in a plural imaging mode of operation wherein a plurality of images are recorded sequentially upon a single actuation of a key by an operator, said apparatus defining a recording medium feeding path and comprising:
exposing means for exposing an elongated continuous form photosensitive recording medium to a light image at predetermined time intervals as the photosensitive recording medium is fed along said recording medium feeding path, said exposing means having an exposure position at which a leading edge of a portion of the photosensitive recording medium is located prior to exposure thereof to the light image;
recording medium feeding means for feeding said photosensitive recording medium from an upstream side of said exposure position to a downstream side thereof along said recording medium feeding path; and
controlling means for controlling said recording medium feeding means so that a speed of feeding of the photosensitive recording medium at said exposure position during a non-exposing operation between exposing operations is always slower than a speed of feeding of the photosensitive recording medium at said exposure position during an exposing operation when operating in the plural imaging mode of operation.

12. An image recording apparatus, operable in a plural imaging mode of operation wherein a plurality of images are copied sequentially upon a single actuation of a key by an operator, said apparatus defining a recording medium feeding path and comprising:
exposing means for exposing an elongated continuous form photosensitive recording medium to a light image at predetermined time intervals as the photosensitive recording medium is fed along said recording medium feeding path, said exposing means having an exposure position at which a leading edge of a portion of the photosensitive recording medium is located prior to exposure thereof to the light image;
developing means, disposed downstream of said exposing means with respect to said recording medium feeding path, for developing the exposed photosensitive recording medium;
first recording medium feeding means for feeding said photosensitive recording medium upstream of the exposure position with respect to said recording medium feeding path;
second recording medium feeding means for feeding said photosensitive recording medium downstream of the exposure position through the developing means with respect to said recording medium feeding path; and
controlling means for controlling said first recording medium feeding means and said second recording medium feeding means so that the speed of feeding of the photosensitive recording medium by said first recording medium feeding means is faster than the speed of feeding of the photosensitive recording medium by said second recording medium feeding means, at least during an exposing operation when the photosensitive recording medium is being exposed to the light image when said apparatus is operating in said plural imaging mode of operation; and
wherein said controlling means controls said first recording medium feeding means and said second recording medium feeding means so that the speed of feeding of the photosensitive recording medium by said first recording medium feeding means is substantially equal to the speed of feeding of the photosensitive recording medium by said second recording medium feeding means at all times between exposing operations when said plural imaging mode is set by said setting means.

* * * * *